Oct. 26, 1971 TSU-FANG CHEN 3,614,964

CLOCK PULSE GENERATING SYSTEM

Filed Sept. 16, 1969

INVENTOR

Tsu Fang Chen

BY Charles E. Engfield

AGENT

United States Patent Office 3,614,964

Patented Oct. 26, 1971

3,614,964

CLOCK PULSE GENERATING SYSTEM

Tsu-Fang Chen, Plymouth Meeting, Pa., assignor to Sperry Rand Corporation, New York, N.Y.

Filed Sept. 16, 1969, Ser. No. 858,260
Int. Cl. F15c *1/08*
U.S. Cl. 137—81.5 5 Claims

ABSTRACT OF THE DISCLOSURE

A plurality of high frequency pure fluid oscillators are interconnected to form a high frequency clock pulse generating system. The interconnection is through a short delay duct which joins the control nozzles of adjacent oscillators together so as to phase synchronize the oscillators.

Figure 1:
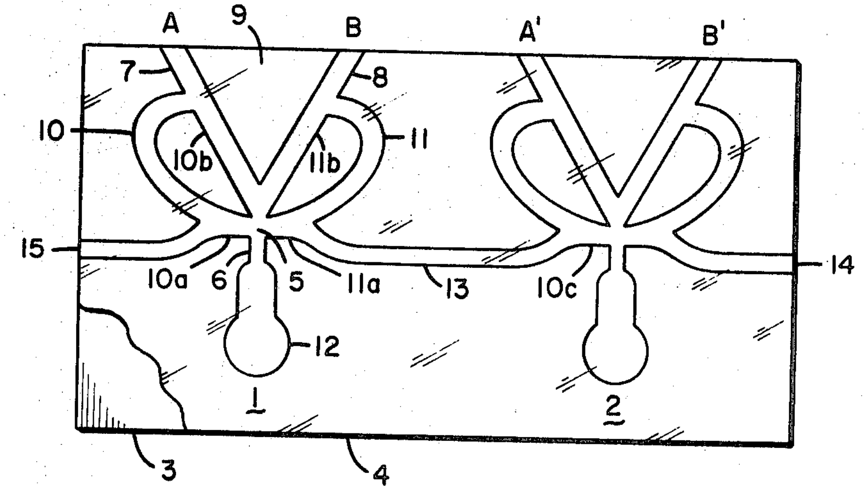

This invention relates to a fluid clock pulse generating system and in particular to a high speed fluid clock pulse generating system.

BACKGROUND

It frequently occurs in large complex fluid control systems of the digital variety that a large number of clock pulses operating at high frequencies (up to 5 kHz.) are required in order to control the timing and switching of the logic signals. One approach to the solution of this problem is the use of a single large high powered oscillator element of a known type. This approach, however, is not satisfactory at high speeds since the high powered oscillator element must be of considerable size in order to supply the power required for a great number of clock pulses and then due to its size the oscillator cannot be readily designed to successfully operate at high frequencies.

Another approach to the problem of providing a great number of clock pulses is the use of a single low powered oscillator element which drives a series of amplifiers each of which provides a plurality of output taps for the numerous clock pulses required. Here again this solution is not satisfactory since it requires a great number of elements and the interconnection of the elements creates a delay in signal propagation from element to element which in turn produces a problem with respect to the phasing of the clock pulses themselves.

It is accordingly an object of this invention to provide a simple yet reliable means for generating a great number of clock pulses at high clock rates.

BRIEF SUMMARY OF THE INVENTION

In accordance with the teachings of this invention a high speed clock generating system is provided which comprises a plurality of low powered, high speed fluid oscillator devices. Each of the oscillator devices is of conventional design and includes a so-called "boundary layer" fluid amplifier which has a fluid interaction chamber, a fluid power input nozzle venting into said chamber, a pair of output ducts leading from the chamber and a pair of fluid control nozzles one disposed on each side of the power input jet adjacent the power input nozzles. A separate fluid feedback duct or path connects the outputs of the amplifier to the respective control input nozzles so as to form an oscillator the natural frequency of which is dependent upon the length or delay characteristic of the feedback path. The resultant oscillators are made as nearly as possible identical in configuration so that their natural frequencies are substantially the same. A separate fluid duct is then used to interconnect a control nozzle of each oscillator in the plurality to the adjacent oscillator and this duct acts to phase strap the oscillators together so that the switching impulses in each oscillator are transmitted to the adjacent oscillator to control the phasing of the adjacent oscillator. In this way a plurality of low powered, high frequency oscillators can be made to operate in synchronism. Then the output from each oscillator can be coupled to a power divider from which a multiplicity of clock pulses can be derived.

Figure 2:
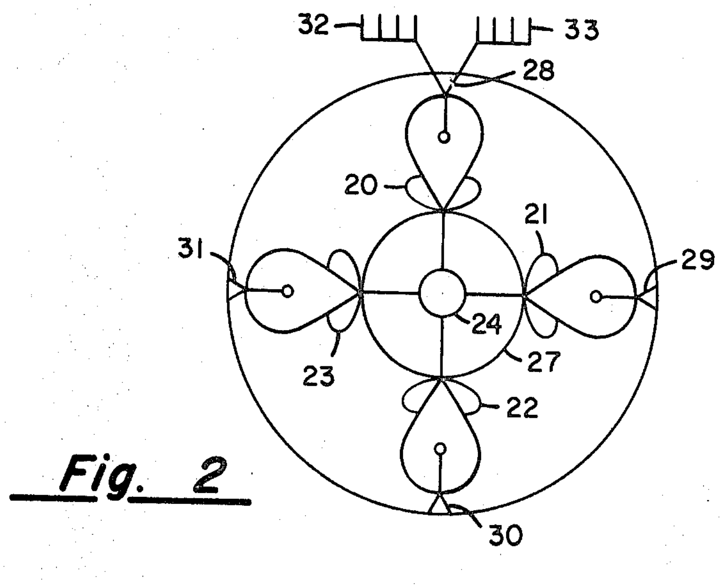

Other objects and features of the present invention will become apparent upon careful consideration of the following description when taken in conjunction with the accompanying drawings, in which FIG. 1 is a top elevational view of a typical embodiment of the present invention; and FIG. 2 is a diagrammatic representation of a further embodiment of the present invention.

In FIG. 1 to which reference is now made, 1 and 2 represent a pair of fluid oscillator devices the fluid channels of which are milled or molded into a suitable base member 3 which may be, for example, made of plastic material. In this event it is quite common to mold the oscillator elements 1 and 2 into the base material 3. Covering the base member 3 so as to provide a fluid type seal relative to the base member 3 is a suitable cover plate 4 which may also be made of a plastic material cemented to the base plate 3 itself.

The oscillators 1 and 2 are of identical construction and therefore only one of the oscillators, 1, will be described in detail. As shown the oscillator 1 comprises a fluid interaction chamber 5 from which a pair of output ducts 7 and 8 extend. Entering into the bottom of the interaction chamber 5, as viewed in this figure, is a power nozzle 6 coupled to an apertured opening 12 to which air under suitable pressure may be admitted. Air supplied to opening 12 is shaped into a jet by the power nozzle 6 as it enters the interaction chamber 5. Located downstream from the power nozzle and preferably symmetrically positioned relative thereto is a wedge-shaped divider element 9. A pair of feedback paths 10 and 11 connect the respective output ducts 7 and 8 to the control nozzles **10*a* and 11*a*** to thereby form the oscillator.

The oscillators 1 and 2 are preferably of the so-called "boundary layer" type which operate as follows: The air jet admitted into the interaction chamber 5 by the nozzle 6 enters the interaction chamber 5 and under the influence of the side walls **10*b* and 11*b* the jet attaches to one of these side walls and exits out the associated output duct 7 or 8 to produce output A or B. Assume it first exits from duct 8 to produce output B. A portion of the jet is fed back through the then active feedback path 11 into the associated control nozzle 11*a*. After a period of time depending upon the length and size of the active feedback duct 11, the feedback energy or fluid issuing from the appropriate control nozzle 11*a* dislodges the power jet from its attached wall 11*b* and deflects the power jet to the opposite wall 10*b*. The jet then exits out duct 7 to produce output A. A portion of the fluid energy is now fed back through the feedback path 10 to control nozzle 10*a*. This feedback energy eventually dislodges the jet from the wall 10*b* and returns it to wall 11*b* and duct 8. This action repeats itself at a rate dependent upon the delays provided by feedback ducts 10 and 11 so that the power jet issuing from nozzle 6 will alternately exit from ducts 7 and 8 at a repetition rate dependent upon the delay of feedback paths 10 and 11**.

Oscillator 2 which is similar in design operates in the same manner as above described and essentially at the same frequency. To control the phasing of the operation of the two oscillators their control jets **11*a* and 10*c* are interconnected by means of a short duct 13 in the manner shown. Duct 13 may be and preferably is of a short length relative to the wavelength of the natural oscillating frequency of the two oscillators 1 and 2. In a typical embodiment a plurality of such oscillators each linked by a suitable control duct, such as 13, would be provided. The control ducts 14 and 15 symbolize the interconnection of such additional oscillator elements to one another and to the oscillators 1 and 2**.

While the oscillators 1 and 2 can be made to operate in either of two modes; i.e. either in phase or 180° out of phase assume for purposes of illustration that the in phase mode is desired. In this case the A and A′ outputs would be high simultaneously and the B and B′ outputs would be high simultaneously. In this mode the length of the duct 13 is typically made short in relation to the wavelength of the operating frequency. Further assume that in starting the oscillators a control pulse is momentarily applied to duct 14 so that the oscillators will start in the in phase mode producing simultaneously the A and A′ outputs. Under this condition the power jet flowing out the left-hand duct of oscillator 2 to produce the A′ output compresses the fluid in the strapping or control duct 13 and this signal propagating through duct 13 tends to hold the power jet of oscillator 1 in the output A state which is the desired condition. Now assume that the power jet from oscillator 2 due to its feedback path switches to output B′. At this time the compression signal fed through the control path 13 is removed and the power jet in oscillator 1 can then switch to output duct 8 to produce the B signal. In the alternative and under the previous assumed conditions, assume that the power jet in oscillator 1 switches to its right-hand duct 8 to produce the output signal B in advance of the time that the oscillator 2 would normally switch. In this case the power jet now flowing out output duct 8 producing the signal B also causes the pressure at the control nozzle 10*c* of oscillator 2 to increase because of the control duct 13 and thereby accelerates the switching of the power jet of oscillator 2 from output A′ to output B′ to thereby continue to maintain the oscillators in step.

Under the assumed conditions the phase strapping duct 13 is assumed to produce a delay which is small relative to the wavelength of the operating frequency of the oscillators. In the alternative the delay produced by duct 13 can equal an integral number of full wavelengths of the operating frequency of the oscillators. If it is desired that the clock pulses from output A are to be synchronized with the output B′ of oscillator 2 then the delay of the strapping duct 13 would be chosen to equal an integral multiple of half wavelengths of the operating frequency of the oscillators since in this case the oscillators 1 and 2 would be held in 180° phase relation to one another.

FIG. 2 to which reference is now made, shows an alternate embodiment of the present invention wherein four oscillators are strapped together. These oscillators are diagrammatically illustrated at 20, 21, 22 and 23. In this embodiment a central apertured plenum 24 is provided and suitable fluid power leads radially extend from the plenum 24 into the power nozzles of the oscillators. The phase strapping duct is shown at 27 and is made circular in configuration. Here again, each of the oscillators are essentially identical in design and each feeds the control inputs of a respective buffer amplifier 28, 29, 30 and 31. Each of the amplifiers 28, 29, 30 and 31 in turn may then be used to feed multiple output taps through suitable power dividers such as is shown at 32 and 33. The purpose of the buffing amplifiers is to isolate the loads which are attached to the outputs therefrom and the oscillators themselves and to permit the oscillators to operate at their natural frequency unencumbered by the attached loads.

In a typical example and referring back to FIG. 1, the oscillators were adjusted to operate at a natural frequency of five kHz. In this embodiment the power nozzle 6 had a width of 0.003 inch and a depth of 0.010 inch. The point of the divider 9 was located between 7 and 12 power nozzle widths downstream from the power nozzle and each of the feedback paths 10 and 11 had a length of 0.250 inch. The length of the phase control strap 16 was set at .200 inch.

Although only certain specific and limited embodiments have been shown of the present invention it will be apparent that other embodiments are possible thereof without departing from the true spirit of the teachings of this invention.

The embodiments of the invention in which an exclusive property or privilege is claimed are defined as follows:

1. A fluid clock pulse generating system comprising a plurality of fixed frequency fluid oscillator devices each tuned to operate at the same frequency and each of said devices including a fluid interaction chamber, a fluid power input nozzle venting into said chamber, a pair of fluid output ducts leading from said chamber and a pair of fluid input control nozzles communicating with the power input nozzle adjacent its point of entry into said interaction chamber, fluid feedback means regeneratively interconnecting said output ducts to said input control nozzles so as to form an oscillator the natural frequency of which is related to the delay of said feedback paths, and a fluid duct means interconnecting an input control duct of one oscillator device to an input control nozzle of the adjacent oscillator device, said fluid duct means being operative to transmit signals from the interaction chamber of each oscillator to the adjacent oscillator thereby a synchronize the phase and frequency of the oscillators.

2. The combination set forth in claim 1 wherein each oscillator device is substantially identical.

3. The combination set forth in claim 1 wherein the interconnecting duct is a fractional part of a wavelength of the operating frequency of said oscillator devices.

4. The combination set forth in claim 1 wherein there is included a plurality of pulse output points and a plurality of fluid amplifiers each interconnecting the output from the respective oscillator devices to respective output points of said system.

5. The combination set forth in claim 1 wherein there is included at least three equally spaced oscillator devices and a first interconnecting duct interconnecting a control nozzle of the first oscillator device to a control nozzle of the second device and a second interconnecting duct connecting the second control nozzle of the second oscillator to a control nozzle of the third oscillator.

References Cited

UNITED STATES PATENTS

| | | | |
|---|---|---|---|
| 3,117,593 | 1/1964 | Sowers III | 137—81.5 X |
| 3,273,377 | 9/1966 | Testerman et al. | 137—81.5 X |
| 3,442,281 | 5/1969 | Warren | 137—815 |
| 3,467,125 | 9/1969 | Dexter | 137—815 |
| 3,499,460 | 3/1970 | Rainer | 137—815 |
| 3,508,565 | 4/1970 | Strantz | 137—815 |

SAMUEL SCOTT, Primary Examiner